US010264701B1

(12) United States Patent
Norton

(10) Patent No.: US 10,264,701 B1
(45) Date of Patent: Apr. 16, 2019

(54) MULTI-CONFIGURATION RESOURCE MODULE BAY

(71) Applicant: HEWLETT PACKARD ENTERPRISE DEVELOPMENT LP, Houston, TX (US)

(72) Inventor: John Norton, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/021,658

(22) Filed: Jun. 28, 2018

(51) Int. Cl.
*H05K 7/14* (2006.01)
*A47B 81/00* (2006.01)
*A47B 57/10* (2006.01)
*A47B 57/58* (2006.01)
*H01R 13/518* (2006.01)

(52) U.S. Cl.
CPC .......... *H05K 7/1489* (2013.01); *A47B 81/00* (2013.01); *A47B 57/10* (2013.01); *A47B 57/58* (2013.01); *H01R 13/518* (2013.01)

(58) Field of Classification Search
CPC .................................................. H05K 7/1489
See application file for complete search history.

(56) References Cited

U.S. PATENT DOCUMENTS

| | | | | |
|---|---|---|---|---|
| 3,807,572 A | * | 4/1974 | Luvara ................. | A47B 47/042 211/10 |
| 5,235,493 A | * | 8/1993 | Yu ........................... | G06F 1/181 312/223.2 |
| 5,450,285 A | * | 9/1995 | Schlemmer ............ | A47B 91/00 248/615 |
| 5,513,068 A | * | 4/1996 | Girard ..................... | G06F 1/181 361/679.37 |
| 5,587,877 A | * | 12/1996 | Ryan ...................... | A47B 21/00 312/223.2 |
| 5,724,227 A | * | 3/1998 | Hancock ................. | G06F 1/184 361/679.32 |
| 6,075,694 A | * | 6/2000 | Mills ...................... | G06F 1/187 312/223.2 |
| 6,122,173 A | * | 9/2000 | Felcman .................. | G06F 1/16 312/223.1 |

(Continued)

FOREIGN PATENT DOCUMENTS

DE 9308494 U1 9/1993
DE 19917406 A1 10/2000

OTHER PUBLICATIONS

Broadberry Data Systems Ltd., "Intel Modular Multi-Flex Blade Server," 2018, pp. 1-9 (online), Retrieved from the Internet on Jan. 15, 2018 at URL: <broadberry.co.uk/intel-blade-servers>.

*Primary Examiner* — Lisa Lea-Edmonds
(74) *Attorney, Agent, or Firm* — Hewlett Packard Enterprise Patent Development

(57) ABSTRACT

An example multi-configuration bay for housing resource modules for a computing device. The multi-configuration bay includes a common bay and an adaptor that may be removably installed within the common bay. The common bay includes first rails on its top and bottom walls, the first rails being to hold resource modules in vertically oriented installed-positions within the common bay. The adaptor includes second rails on its side walls, the second rails being configured to hold resource modules in horizontally oriented installed-positions within the common bay (when the adaptor is installed in the common bay).

20 Claims, 12 Drawing Sheets

(56) References Cited

U.S. PATENT DOCUMENTS

| | | | |
|---|---|---|---|
| 6,362,955 B2 | 3/2002 | Felcman et al. | |
| 6,548,753 B1 * | 4/2003 | Blackmon, Jr. | H05K 7/20009 174/17 VA |
| 6,618,247 B2 * | 9/2003 | Felcman | G06F 1/16 312/223.1 |
| 7,190,574 B2 * | 3/2007 | Muenzer | G06F 1/181 312/223.2 |
| 7,200,003 B2 * | 4/2007 | Hood | G06F 1/181 312/223.1 |
| 7,289,317 B2 * | 10/2007 | Hood | G06F 1/181 361/679.33 |
| 7,352,569 B2 * | 4/2008 | Muenzer | G06F 1/181 312/223.2 |
| 7,469,978 B2 * | 12/2008 | Liang | E05C 3/047 312/223.2 |
| 7,639,486 B2 * | 12/2009 | Champion | G06F 1/183 211/26 |
| 8,570,750 B2 * | 10/2013 | Fang | G11B 33/128 312/223.1 |
| 9,167,716 B2 * | 10/2015 | Ma | H05K 7/1489 |
| 2018/0343766 A1 * | 11/2018 | Hartman | H05K 7/1489 |

\* cited by examiner

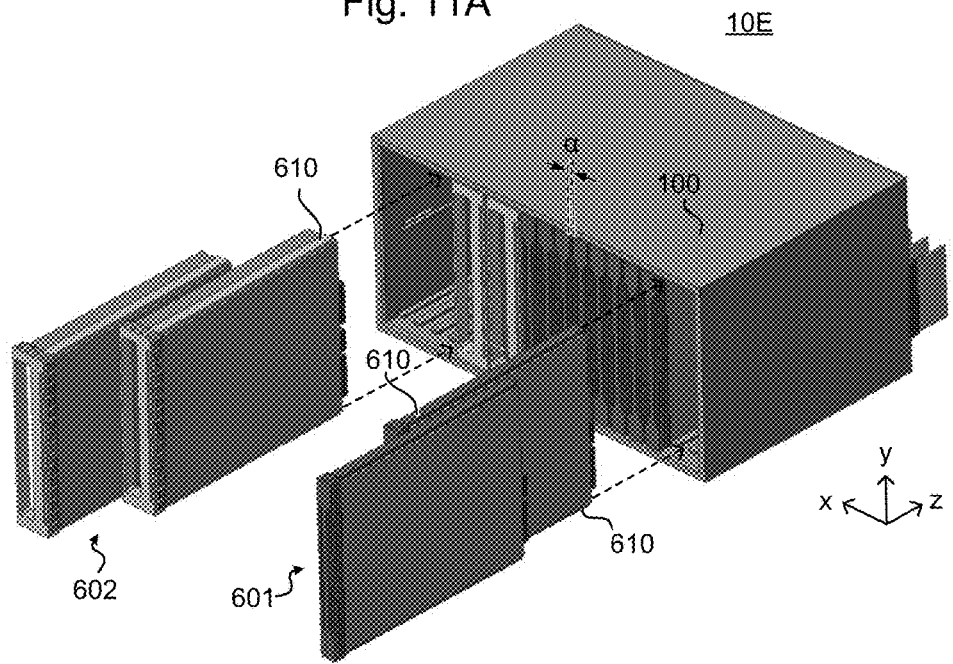
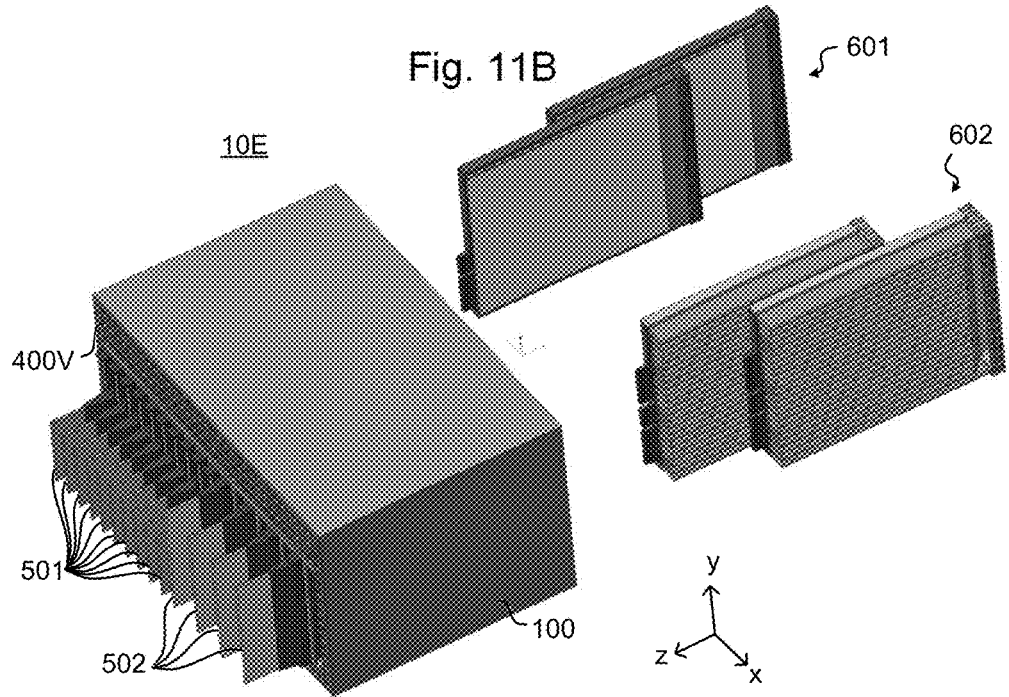

US 10,264,701 B1

MULTI-CONFIGURATION RESOURCE MODULE BAY

BACKGROUND

Computing systems—such as servers, storage arrays, converged systems, composable systems, etc.—may include processing units that utilize various resources, such as memory, storage devices, accelerators, and the like. In some architectures, the resources may be provided as resource modules which are modular self-contained packages having standardized form-factors and which are physically separate from the processing units. The resource modules may be connected indirectly to the processing units, for example via cabling, a midplane, network devices, or the like.

BRIEF DESCRIPTION OF THE DRAWINGS

FIG. 11A illustrates a front perspective view of a first vertical configuration of an example multi-configuration bay.

FIG. 11B illustrates a rear perspective view of the first vertical configuration.

DETAILED DESCRIPTION

Figure 1:
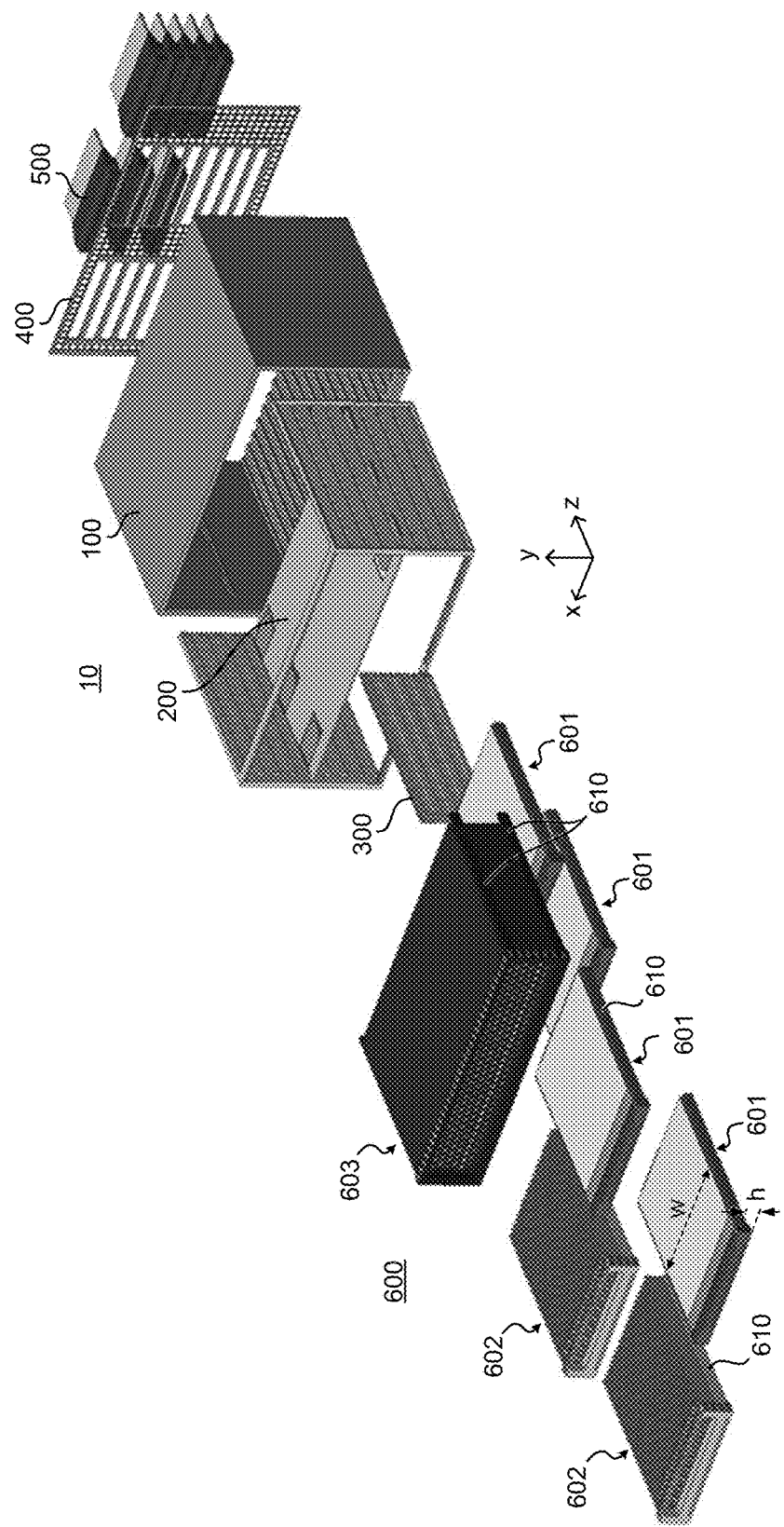
FIG. 1 illustrates an exploded view of an example multi-configuration bay, resource modules installed therein, and connectors connected thereto.

Multiple resource modules may be housed in an enclosure that may be referred to as a bay, which itself may be housed within a chassis of a computing system. The bay may include engagement features that hold the resource modules in installed positions and provide physical support for the resource modules. The bay may also hold communications connectors (e.g., electrical and/or optical connectors) in locations aligned with the installation positions, such that a resource module installed in the bay can be electrically and/or optically connected (e.g., via cables) to the main board(s) of the computing system. In addition, the bay may provide electromagnetic interference (EMI) shielding for the resource modules housed therein.

In general, manufacturers may desire to offer multiple distinct configurations for their computing systems, so that they can better serve varied needs of customers. In particular, manufacturers may desire to offer a family of computing systems that all have a similar architecture as one another but that have multiple different resource module configurations. For example, one configuration may include just storage resource modules, another configuration may include a mix of storage resource modules and memory resource modules, another configuration may include accelerators, and so on. As another example, some configurations may include vertically oriented resource modules, some configurations may include horizontally oriented resource modules, some configurations may include both vertically and horizontally oriented resource modules, and some configurations may include different form factors of resource modules (e.g., modules with different widths or heights).

However, to produce such a variety of different resource module configurations, the manufacturer may need to design different types of bays to house the different combinations of resource modules. For example, a configuration that has storage resource modules vertically oriented may require a first type of bay, while a configuration that has accelerator resource modules oriented horizontally may require a second type of bay. However, this can lead to increased production costs and stock-keeping-unit (SKU) proliferation, since multiple different bays need to be designed, produced, and stocked in order to ensure that all of these different resource module configurations can be produced.

Thus, an example multi-configuration bay is disclosed herein that can alleviate the above-noted concerns, among others. In particular, the multi-configuration bay is capable of being configured into multiple different configurations. For example, the multi-configuration bay is capable of being placed in configurations in which the bay holds resource modules vertically ("vertical configurations") and configurations in which the bay holds resource modules horizontally ("horizontal configurations"). As another example, the multi-configuration bay may be capable of being placed in multiple configurations that accommodate different sizes and combinations of resource modules. Thus, a single bay may be used to construct a variety of different resource module configurations, thereby avoiding the costs and SKU proliferation mentioned above that would otherwise occur if unique bays were designed for each such configuration.

In particular, the multi-configuration bay may include a common bay (see FIG. 2) and an adaptor (see FIG. 3) that is designed to be inserted into the common bay, and the configuration of the configurable bay may be changed by inserting or removing the adaptor from the common bay. For example, the multi-configuration bay may be configured to a horizontal configuration by inserting the adaptor in the common bay (see FIG. 1), and the multi-configuration bay may be configured to a vertical configuration by removing the adaptor from the common bay (see FIG. 11). For example, the adaptor may include rails that are on vertical side walls of the adaptor and that are designed to hold horizontally oriented resource modules, and therefore when the adaptor is installed in the common bay the rails of the adaptor may hold resource modules in horizontally oriented installed positions. In addition, the common bay may include rails that are on horizontal top and bottom walls of the common bay and that are designed to hold vertically oriented resource modules, and therefore when the adaptor is removed from the common bay the rails of the common bay may hold resource modules in vertically oriented installed positions.

In addition, in some examples the multi-configuration bay may include one or more vertical dividers that are designed to be installed vertically between side walls of the common bay when the adaptor is installed therein. The vertical dividers may include rails designed to hold horizontally oriented resource modules. Different horizontal configurations of the multi-configuration bay may be obtained based on how many of the vertical dividers are used and where they are installed. These different horizontal configurations may accommodate resource modules with different widths.

Not only does the multi-configuration bay enable the multiple configurations to be created from a single bay, it also may provide additional benefits. For example, the multi-configuration bay may, in some examples, allow a computing device to be reconfigured post manufacture. For example, a computing device initially configured to house resource modules horizontally could be reconfigured to house resource modules vertically by removing the adaptor, or vice-versa. As another example, the form factors (e.g., widths) of resource modules that can be included in the bay may be changed by inserting or removing vertical dividers. In some examples, this reconfiguration may be accomplished without needing specialized tools and/or without needing to disassemble the chassis. In addition, in some examples the reconfiguration may be done without needing to buy, produce, or obtain any extra parts (e.g., reconfiguring the bay by simply removing the adaptor or the vertical divider).

Achieving such post-manufacture reconfiguration would be more difficult in approaches in which unique bays are designed for each different resource module configuration. For example, to change the resource module configuration according to such an approach may require the entire bay to be removed from the computing device and a new bay installed. This may be difficult, as removing a bay from the chassis may require disassembly of the chassis and/or specialized tools, especially when the bay is permanently connected to the chassis (e.g., welded to, riveted to, integrally formed in, etc.). In addition, such an approach requires the person reconfiguring the bay to buy, produce, or otherwise obtain the new bay.

1. Example Multi-Configuration Bay

FIG. 1 illustrates, in exploded perspective view, an example multi-configuration bay 10, together with example resource modules 600 housed in the multi-configuration bay 10. The multi-configuration bay 10 includes a common bay 100 (see also FIGS. 2 and 5), an adaptor 200 that is installable within the common bay 100 (see also FIGS. 3 and 5), a vertical divider 300 that is installable in the common bay between the side walls 201R/L of the adaptor (see also FIGS. 4-5), and a midplane 400 connected to a rear of the common bay 100 (see also FIG. 6). The common bay 10 is configured to hold computer resource modules 600 in vertically oriented installed-positions when the adaptor 200 is not installed in the common bay 100 (see FIG. 11). The adaptor 200 is configured to hold computer resource modules 600 in horizontally oriented installed positions when it is installed in the common bay 100 (see FIG. 1). The vertical divider 300 is configured to hold, in conjunction with the adaptor 200, resource modules 600 in horizontally oriented installed position when the adaptor 200 and the vertical divider 300 are installed in the common bay 100. Connectors 500 are also illustrated, which may be held by the midplane 400 so as to align with the installed positions of the resource modules 600.

1.1. Example Common Bay

Figure 2:
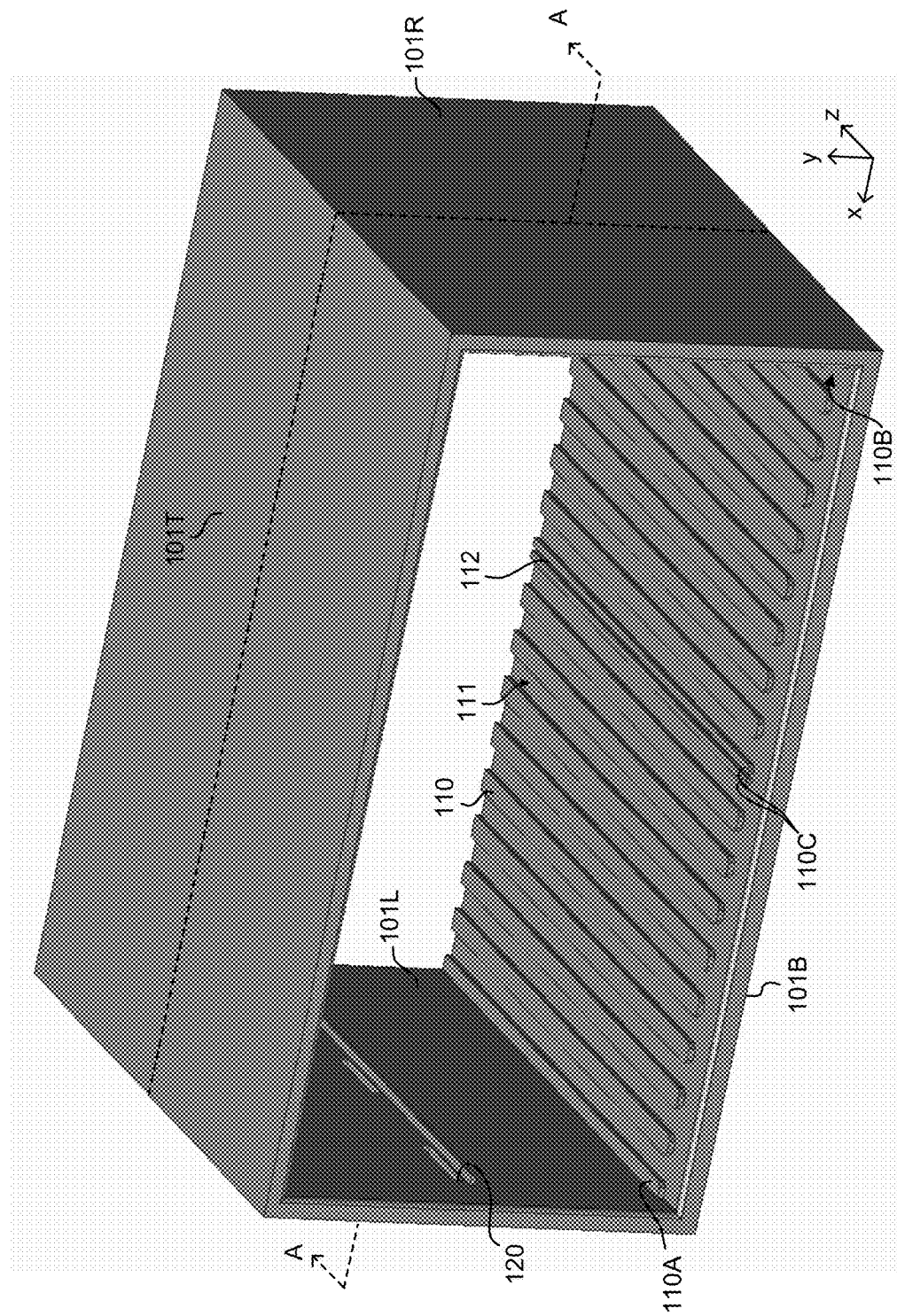
FIG. 2 illustrates a perspective view of an example common bay of the multi-configuration bay of FIG. 1.
Figure 5:
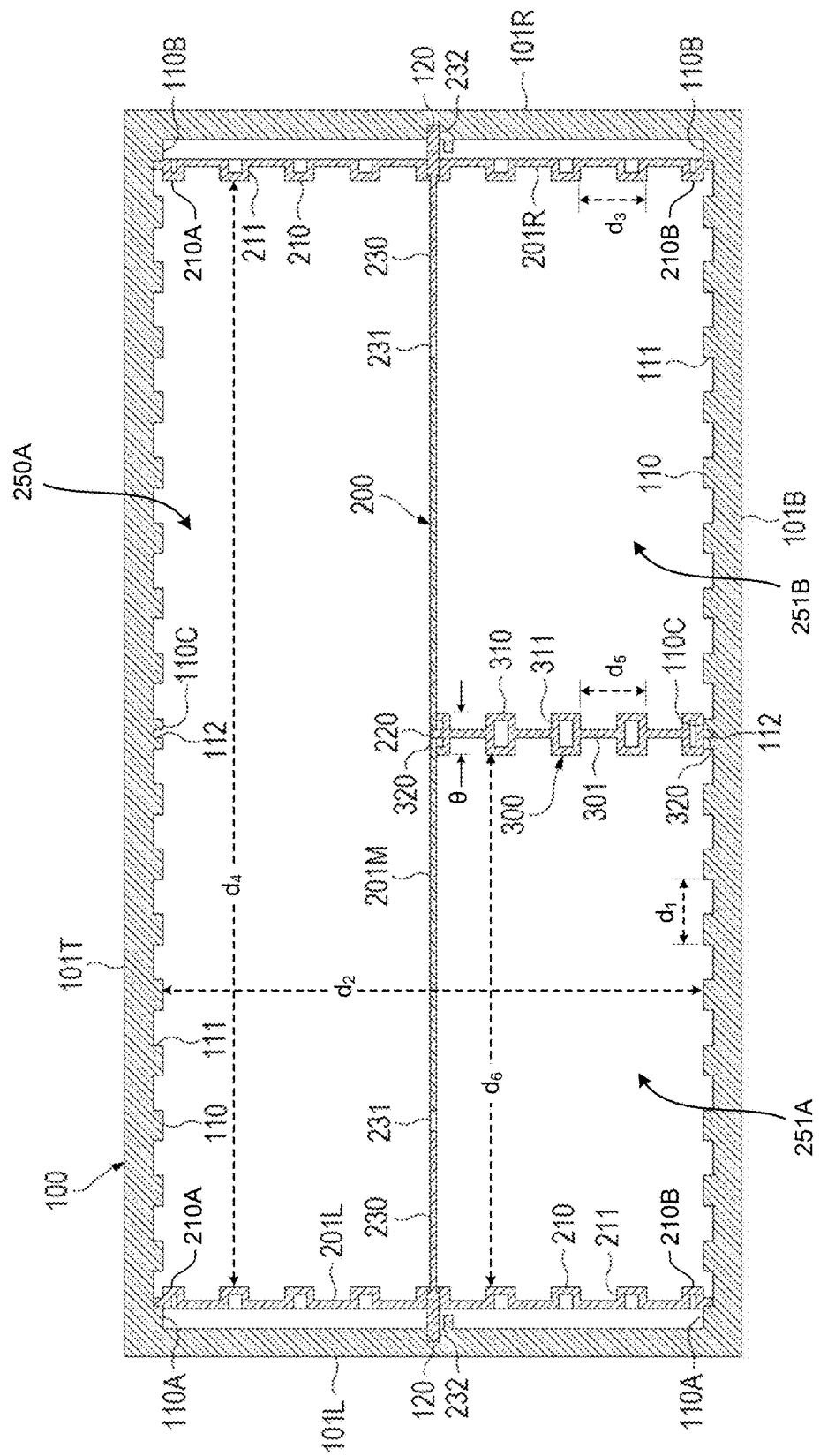
FIG. 5 illustrates a cross-sectional view of the multi-configuration bay of FIG. 1, omitting the midplane, connectors, and resource modules. The cross section is taken along the plane A-A in FIG. 2.

FIGS. 2 and 5 illustrate the common bay 100 (occasionally referred to as "bay 100") in greater detail. The common bay may include four walls 101 connected to one another, and first rails 110 on interior facing sides of the top wall 101T and the bottom wall 101B (see FIGS. 2 & 5). The first rails 110 are configured to hold the resource modules 600 in vertically oriented installed positions (see FIGS. 2, 5, & 11). In particular, the first rails 110 define channels 111 between adjacent rails 110 (see FIGS. 2 & 5), and the resource modules 600 may include engagement features 610 (see FIGS. 1 and 11) that fit into the channels 111 as the resource modules 600 are slid into the bay 100 (see FIG. 11), such that the rails 110 passively guide the resource modules 600 to the installed position as they are slid towards a rear of the bay 100.

The common bay 100 may also include slots 120 in side walls 1011R/101L (see FIG. 2), which are part of a latch that is to secure the adaptor 200 to the common bay 100. For example, the slots 120 may be configured to receive a tab 230 of the adaptor 200 (see FIG. 5).

The rails 110 may be spaced such that the installed resource modules 600 are tightly packed within the bay 100. In this context, tightly packed means that the mean distance (e.g., air gap) between adjacent resource modules 600 (a in FIG. 11A), is less than 2 mm.

In some examples, one or more of the rails 110 may be configured as divider rails 110C, which are designed to accommodate a vertical divider 300. In FIG. 2, one divider rail 110C is illustrated, but in practice any number of divider rails 110C could be included. The divider rail 110C includes a groove 112 that is designed to receive a bottom or top end of the vertical divider 300, thereby helping to secure the vertical divider 300 when installed.

As noted above, the multi-configuration bay 10 may be designed to accommodate specific form factors of resource modules 600. In particular, in some examples, the resource modules 600 may include at least a reference resource module 601 which has a reference form factor, and the common bay 100 may be dimensioned based on the reference form factor. In particular, a rail spacing $d_1$ for the first rails 110 (see FIG. 5) may be set based on a height h of the reference resource modules 601, and a distance $d_2$ between opposing first rails may be set based on the width w of the reference resource modules 601, as described in greater detail below. In this context, "depth" refers to the dimension of the resource modules 600 that extends from front-to-back in the bay 10 when installed therein (which is aligned with the z-direction for the resource modules 600 illustrated in FIG. 1); "width" refers to the longest dimension of the module 600 excluding depth (which is aligned with x-direction for the resource modules 600 illustrated in FIG. 1); and "height" refers to the shortest dimension of the module 600 excluding depth (which is aligned with y-direction for the resource modules 600 illustrated in FIG. 1).

Specifically, for example, the spacing $d_1$ between rails 110 may be equal to h+α, where h is the height of the reference resource module 601 (see FIG. 1) and α is a mean distance between resource modules (see FIG. 11A). As noted above, in some examples a 2 mm, to ensure that the modules 601 are tightly packed in the bay 10. In some examples in which some of the resource modules 600 use the EDSFF form factor (SFF-TA-1009 is standard number), $d_1$ is between 9 and 10 mm—for example, in one implementation α=1.8 mm, h=7.5 mm, and $d_1$=9.3 mm.

In addition, in some examples, the common bay 10 may be dimensioned such that the distance $d_2$ between opposite rails 110 (see FIG. 5), is large enough to allow the reference resource modules 601 to be installed in vertical orientation and small enough that the reference resource modules 601 are still held securely by the rails 110. In other words, $w<d_2<w+\delta$, where w is the width of the reference resource module 601 excluding its engagement features 610 and w+δ is the width of the reference resource module 601 including its engagement features 610. For example, in some examples in which the reference resource modules 601 have the EDSFF form factor, $d_2$ is between 70 and 80 mm—for example, in one implementation $d_2$ is 76 mm.

In addition, in some examples, the width of an interior chamber of the common bay 10 may be such that an integer number of reference resource modules 601 can be tightly packed in the common bay 10. For example, if the common bay 10 is to have a capacity to house k vertically oriented reference resource modules 601, then the width of the common bay 10 may be approximately $k*d_1$. In addition, in some examples, the width of the interior chamber of the common bay 11 may be sufficiently wide to accommodate the adaptor 200 that has an interior dimension of $d_4$, as illustrated in FIG. 5 and described below.

The widths and heights of the rails 110 may be set based on the engagement features 610 of the reference resource modules 601, which may be for example, a flange, a roller, a rail, etc. For example, if the engagement features 610 of the resource modules 600 are x-mm in height, then the channels 111 may each be (x+ε) mm wide and the rails 110 may each be $(d_1-x-\varepsilon)$ mm wide, where ε constitutes a small tolerance to allow sliding. The first rail 110A and the last rail 110B on each of the walls 101T/101B may be narrower than the other rails 110, to reduce any gap between a first or last resource module 600 and the side walls 102R/102L.

1.2. Example Adaptor and Vertical Dividers

Figure 3:
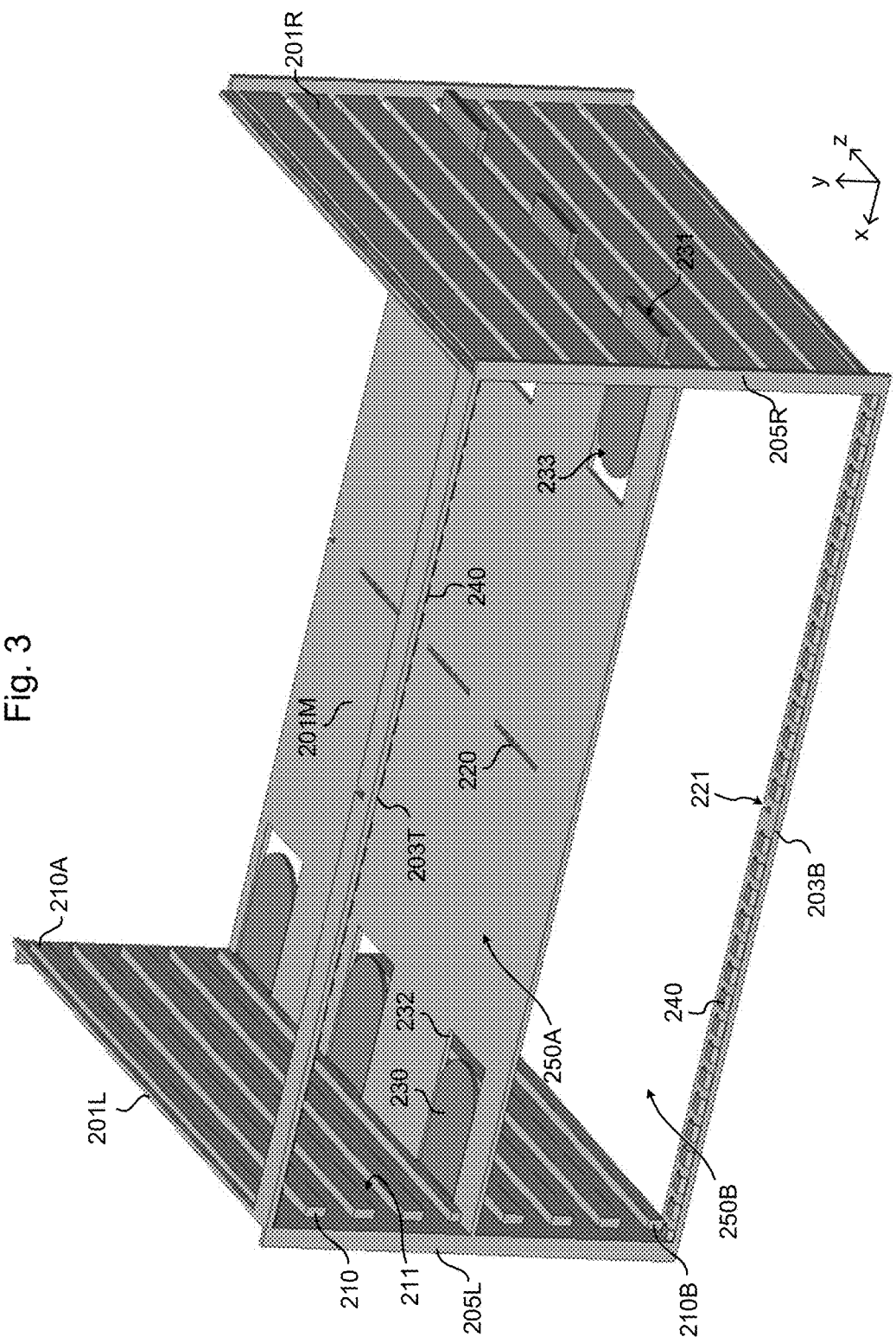
FIG. 3 illustrates a perspective view of an example adaptor of the multi-configuration bay of FIG. 1.
Figure 4A:
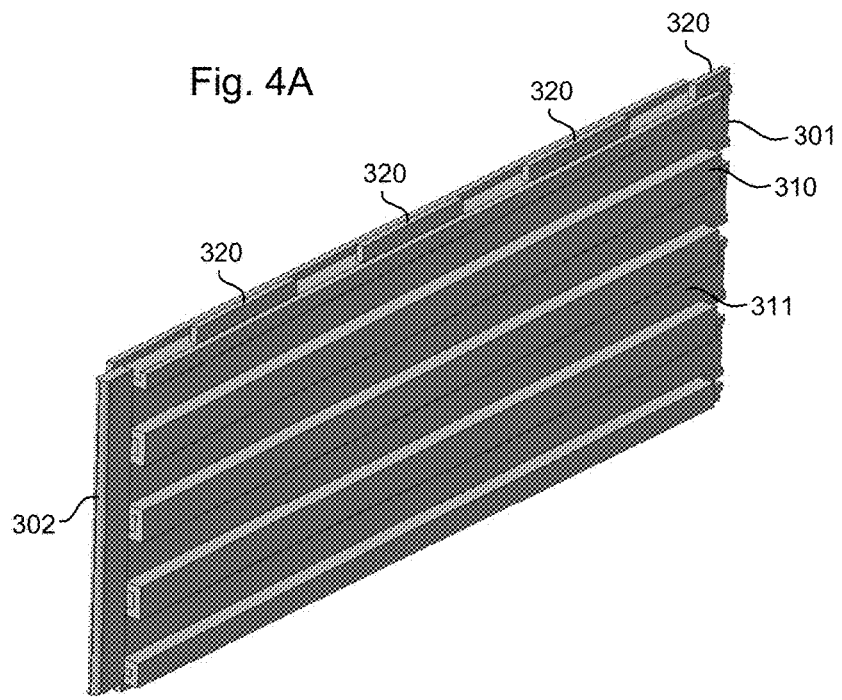
FIG. 4A illustrates a perspective view of an example vertical divider of the multi-configuration bay of FIG. 1.

The adaptor 200 will now be described with reference to FIGS. 3-5. The adaptor 200 includes vertical side walls 201R and 201L, which are connected to one another by a horizontal wall 201M, a top span 203T, and a bottom span 203B (see FIGS. 3 & 5). The adaptor 200 may also include EMI tabs 240. The adaptor 200 also includes second rails 210 on interior sides of the side walls 201R/201L (see FIGS. 3 & 5). The second rails 210 are configured to hold the resource modules 600 in horizontally oriented installed positions (see FIGS. 1, 3, & 5). In particular, the second rails 210 define channels 211 between adjacent rails 210 (see FIGS. 3 & 5), and the resource modules 600 may include engagement features 610 that fit into the channels 211 as the resource modules 600 are slid into the bay 100, such that the rails 210 passively guide the resource modules 600 to the installed position as they are slid towards a rear of the bay 100.

The second rails 210 may be sized and spaced similarly to how the first rails 110 are sized and spaced. In particular, the spacing $d_3$ of the rails 210 (see FIG. 5) may be equal to the spacing $d_1$ of the rails 110, which may be equal to a height h of the reference resource module 601 plus the inter-module gap α. First and last rails 210A/B on each side wall 201R/L may be narrower than the other rails 210 (see FIGS. 3 & 5). In some examples, the horizontal wall 201M may connect to the side walls 201R/L at a rail 210, as illustrated in FIGS. 3 and 5. In other examples (not illustrated), the horizontal wall 201M may connect to the side walls 201R/L in a channel 211.

The horizontal wall 201M defines two spaces 250: one space 250A above the wall 201M and between the walls 201R and 201L, and another space 250B below the wall 201M and between the walls 201R and 201L (see FIG. 3). When the adaptor 200 is installed in the common bay 100, these spaces 250A/B are bounded by the walls 101T and 101B, respectively, and may also be referred to herein as "chambers". Thus, when the adaptor 200 is installed in the common bay 100, the horizontal wall 201M divides the interior of the common bay 100 into two chambers 250A and 250B. The width of each of the chambers 250A/B is $d_4$ (see FIG. 5), and therefore when no vertical dividers 300 are installed, each chamber 250A/B is capable of receiving/holding resource modules 600 that have a width (excluding engagement features 610) of $d_4$.

In some examples, it may be desired for the adaptor 200 to hold resource modules 600 that have widths that are less than $d_4$. To enable this, one or more vertical dividers 300 (see FIG. 3) may be included in one or both chambers 250 of the adaptor 200 (see FIG. 4B). An example vertical divider 300 is illustrated in FIGS. 4-5. When such a divider 300 is included in a chamber 250, it divides the chamber 250 into sub-chambers 251. Specifically, if n vertical dividers are included in a chamber 250, they divide the chamber 250 into n+1 sub-chambers 251. For example, as illustrated in FIGS. 4B and 5, if a single vertical divider 300 is installed in the chamber 250B, it forms two sub-chambers 251A and 251B.

Figure 8A:
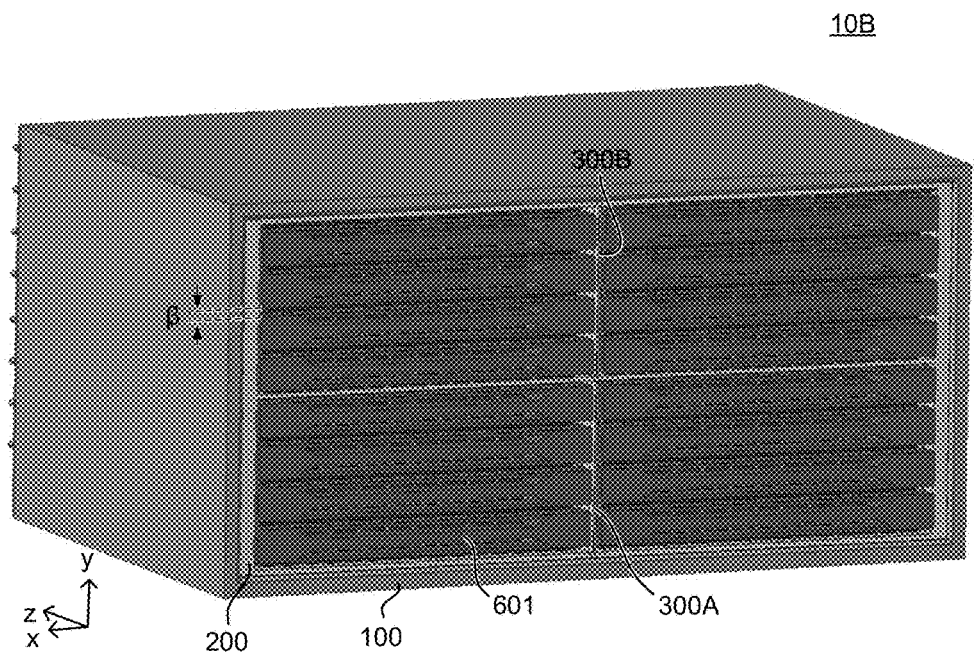
FIG. 8A illustrates a front perspective view of a second horizontal configuration of an example multi-configuration bay with a first combination of resource modules.
Figure 8B:
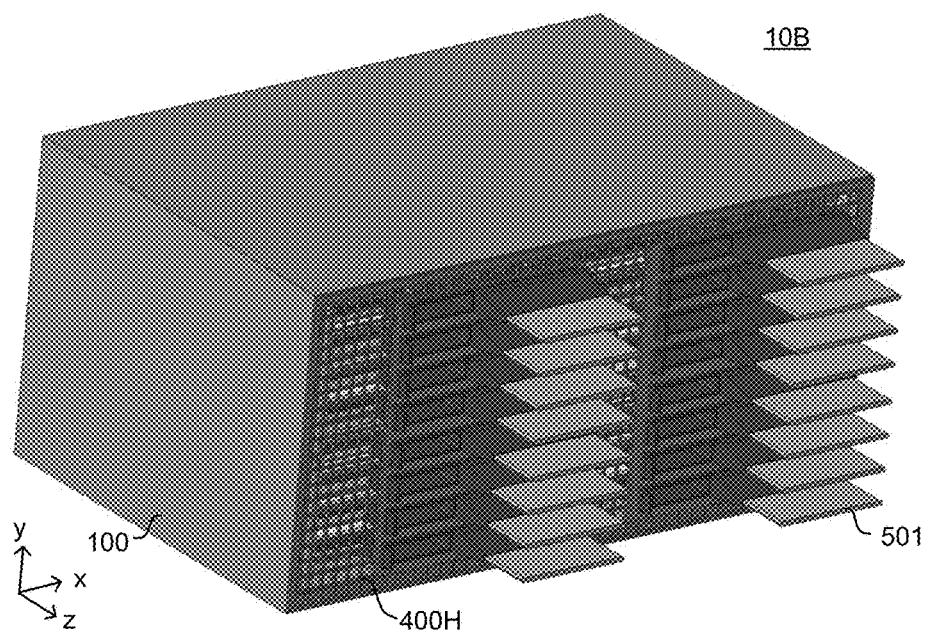
FIG. 8B illustrates a rear perspective view of the second horizontal configuration with the first combination of resource modules.

When a vertical divider 300 is included in the adaptor 200, the second rails 210 of the adaptor 200 may cooperate with third rails 310 of the vertical divider 300 to hold resource modules 600 in horizontally oriented installed positions (see, e.g., FIG. 8A). In other words, instead of both ends of the resource module 600 being held by opposing second rails 210 as would be the case in a chamber 250, in a sub-chamber 251 one end of the resource module 600 may be held by a second rail 210 and the other end may be held by an opposing third rail 310 (or in sub-chambers 251 that are between two vertical dividers 300, both ends of the resource module 600 may be held by opposing third rails 310). Thus, the vertical dividers 300 may enable resource modules 600 having widths that are smaller than $d_4$ to be installed in the sub-chambers 251.

In some examples, the vertical dividers 300 may be reversibly installable in and uninstallable from the adaptor 200. For example, the adaptor 200 may include slots 220 (see FIGS. 3, 4B and 5), which are configured to receive and releasably hold tabs 320 of a vertical divider 300 when it is installed (see FIG. 4A-5). The top and bottom spans 203A/B may also include notches 221 that may releasably hold a front-bottom portion of the vertical divider 300 (see FIGS. 2 and 4B). One benefit of having the vertical dividers 300 be reversibly installable/uninstallable is that it increases the number of distinct configurations that can be created for a computing device using the same basic multi-configuration bay 10. Another benefit is that it may provide additional possibilities for changing the configuration of a computing device after its manufacture.

Figure 4B:
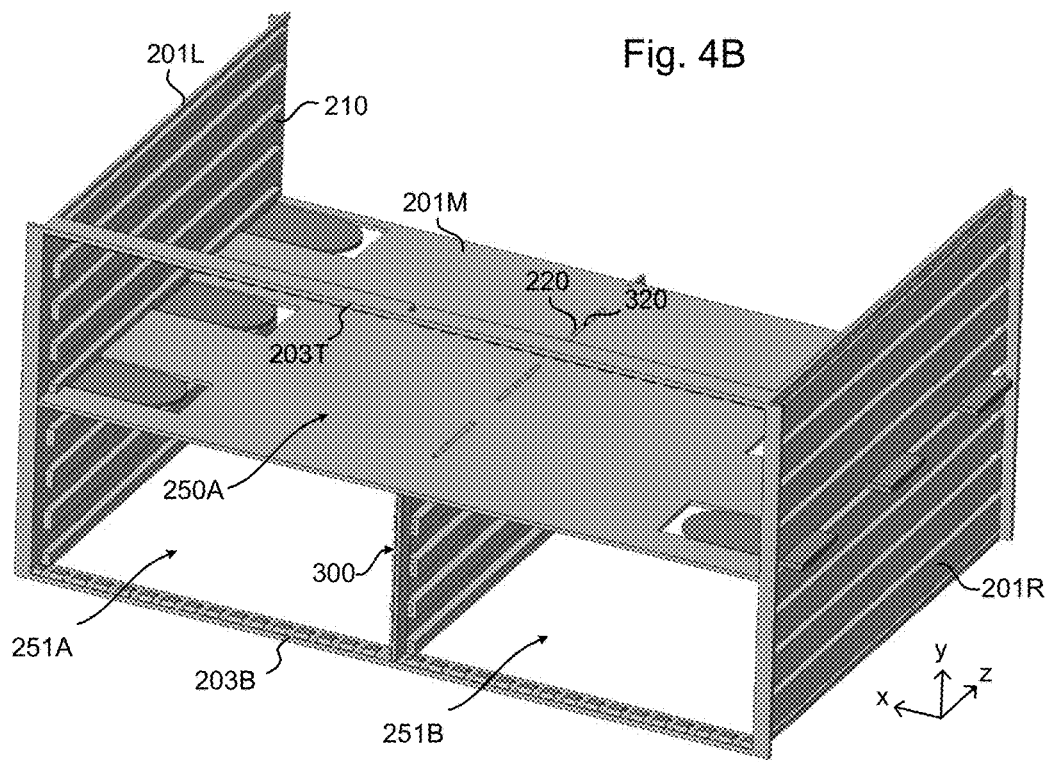
FIG. 4B illustrates a perspective view of the adaptor of FIG. 3 with the vertical divider of FIG. 4A installed.

The vertical divider 300 may be installed in the adaptor 200 by inserting the tabs 320 into the slots 220 and inserting the front-bottom portion of the vertical divider 300 in the notch 221 (see FIG. 4B). In some examples, the divider 300 may be installed in the adaptor 200 when it is outside of the common bay 100, and then the combined adaptor 200 and divider 300 assembly may be installed in the common bay 100 by inserting a rear portion of the adaptor 200/divider 300 assembly into the front side of the interior chamber of the bay 100 and then sliding the assembly rearwards. The bottom portion of the divider 300 may be received in the groove 112 as it is slid rearward in the common bay 100. Once installed, the tabs 220, notches 221, and groove 112 may hold the divider 300 in its installed location (see FIG. 5). To uninstall the vertical divider 300, the reverse of the forgoing operations may be employed.

In some examples (not illustrated), one or more vertical dividers 300 may be permanently included in the adaptor 200. For example, the vertical dividers 300 and adaptor 200 may be integrally formed as one piece, or may be permanently connected to one another (e.g., by welding, adhesive, etc.).

In the example of FIGS. 1-5, the common bay 100 and adaptor 200 are configured to include two installation locations for vertical dividers 300, one in the chamber 250A and one in the chamber 250B. Specifically, the common bay 100 illustrated in these examples includes two grooves 112, one in a top rail 110 and one in a bottom rail 110 (see FIG. 2), and the adaptor includes slots 220 corresponding to both of the grooves 112 (see FIG. 3). Thus, one vertical divider 300 may be installed in one groove 112 and another vertical divider 300 may be installed in the other groove 112, with both dividers 300 using the same set of slots 120 (i.e., one set of slots 120 can accommodate two dividers 300, one above and one below). However, in other examples any number of installation locations for vertical dividers 300 may be included. In addition, in other examples, the installation locations for vertical dividers 300 in the chamber 250A do not necessarily need to align with installation locations for vertical dividers in the chamber 250B. In addition, although three slots 120 are illustrated for the set of slots 120, in other examples any number of slots 120 may be included per set of slots 220.

In some examples, the multi-configuration bay 10 includes latches to secure the adaptor 200 to the bay 100 once it has been installed. For example, the latch may include tabs 230, which are included as part of the adaptor 200, and slots 120, which are included in the walls 101R/L of the common bay 100 (see FIGS. 2, 3, & 5). Specifically, in the examples illustrated in the figures, the adaptor 200 includes tabs 230 that extend through the side walls 201R/L (which may include extending through a rail 210 or through a channel 211) (see FIGS. 2 and 5). The tabs 230 may be aligned with the slots 120 and configured to be slidable in a horizontal direction (i.e., along the x-axis in the figures), such that the tabs 230 can be slid into the slots 120 to secure the adaptor 200 to the bay 100 and slid out of the slot 120 to release the adaptor 200 from the bay 100 (see FIGS. 2 and 5). The tabs 120 may include a first end 231 that engages with the slots 120 and is on an outward facing side of the wall 201R/L, and a second end 233 that can be actuated by a user and is on an inward facing side of the wall 201R/L (see FIGS. 2 and 5). The second ends 233 of the tabs 230 may be located within openings 232 in the horizontal wall 201M (see FIGS. 2 and 5).

The top span 203T and the bottom span 203B may be configured such that, when the adaptor 200 is installed in the common bay 100, the spans 203T/B fit in spaces at a front of the common bay 100 that do not have first rails 110 in them. The top span 203T and the bottom span 203B may include EMI tabs 240, which are to contact installed resource modules 600 and facilitate EMI shielding (see FIG. 3). The top span 203T and the bottom span 203B may also aid in structural support for the adaptor 200. In some examples (not illustrated), the top span 203T and/or the bottom span 203B may be omitted.

In some examples (not illustrated), the horizontal wall 201M may be omitted. In some of these examples, vertical dividers 300 may be included in the adaptor, and these vertical dividers 300 may have a height equal to the full height of the interior of the common bay 100.

As noted above, there is a distance $d_4$ between opposing rails 210 in the adaptor 200. In some examples, the adaptor 200 may be dimensioned such that $d_4$ is equal to $n \cdot d_2 + (n-1) \cdot \theta$, where n is an integer and $\theta$ is a width of the vertical divider 300. These dimensions allow a chamber 250 of the adaptor 200 to be partitioned into up to n+1 sub-chambers 251 by using up to n vertical dividers 300. For example, in the example of FIG. 5, n=2 and therefore $d_4 = 2d_2 + \delta$.

Although an example is illustrated in FIGS. 1 and 5 in which there is one vertical divider 300 in the lower chamber 250B and none in the upper chamber 250A, other arrangements could be included. For example, the vertical divider 300 could be include in the upper chamber 250A but not in the lower chamber 250B, or a vertical divider 300 could be included in both chambers 250A/B, or no vertical dividers 300 could be included in the adaptor 200.

1.3. Example Midplanes

Figure 6A:
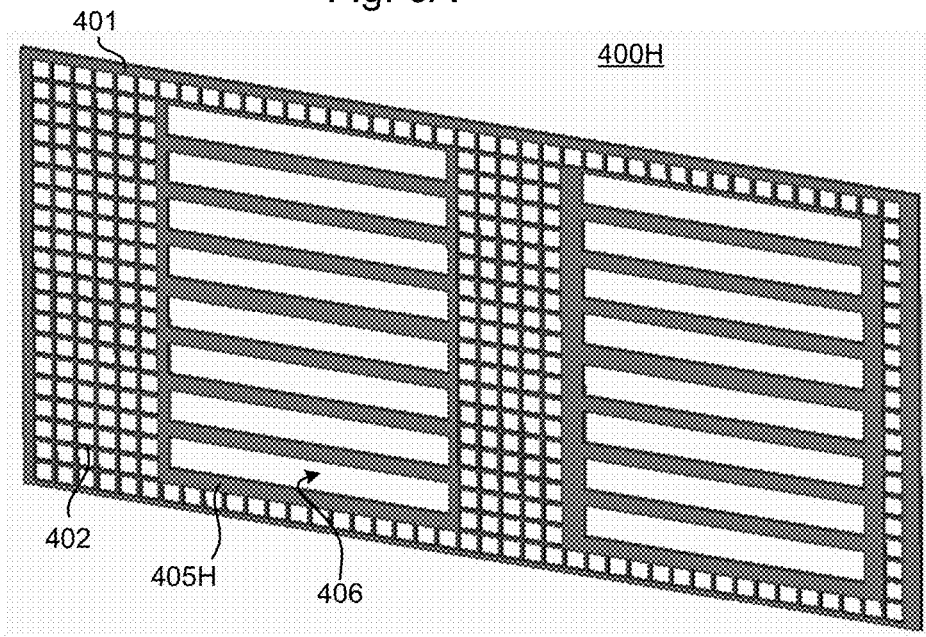
FIG. 6A illustrates a perspective view of an example horizontal midplane of the multi-configuration bay of FIG. 1.
Figure 6B:
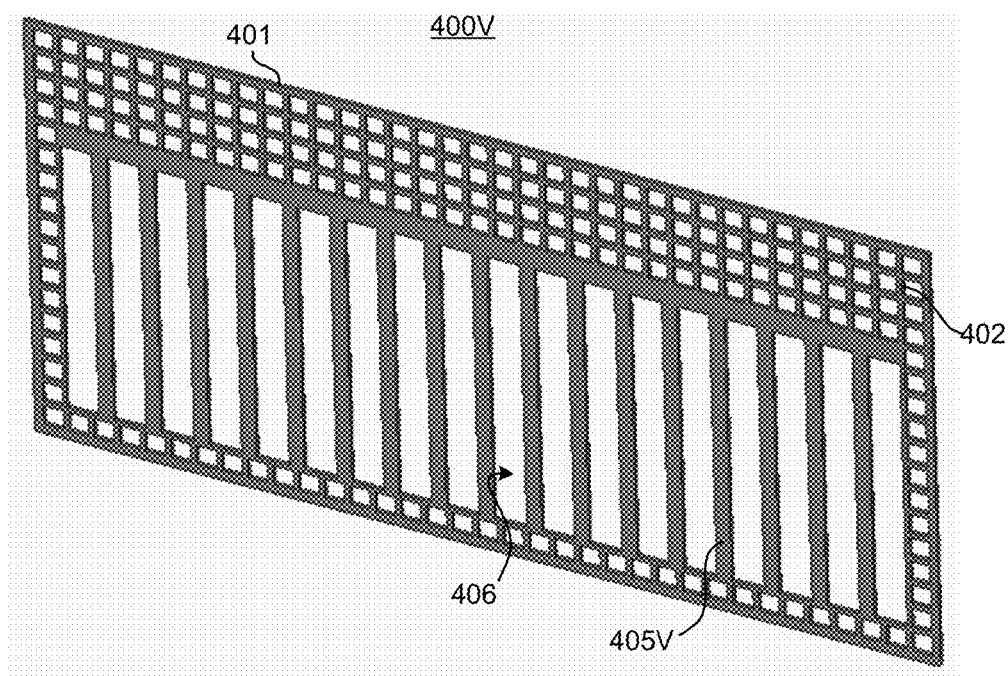
FIG. 6B illustrates a perspective view of an example vertical midplane of the multi-configuration bay of FIG. 1.

FIGS. 6A and 6B illustrate example midplanes of the multi-configuration bay 10. FIG. 6A illustrates a horizontal midplane 400H which is to be used in horizontal configurations of the multi-configuration bay 10. FIG. 6B illustrates a vertical midplane 400V which is to be used in vertical configurations of the multi-configuration bay 10.

The midplanes 400H/V both include an outer frame 401, a mesh (e.g., lattice) 402 connected to the outer frame 401, and connector-frames 405 connected to the mesh 402 and defining apertures 406 in the mesh 402. The connector frames 405 may be configured to receive and hold communications connectors 500, such as electrical or optical cable connectors 500. For example, the connector frames 405 may be to receive Gen-Z connectors 500. For example, the connectors 500 may be pressed into the apertures 406 and then snap onto the connector frames 405. The mesh 402 may fill the entire area encircled by the outer frame 401, with the exception of the regions occupied by the connector-frames 405 and their apertures 406, and may support the connector-frames 405.

The main difference between the horizontal and vertical midplanes 400H/V is the orientation and locations of their connector frames 405. Specifically, the horizontal midplane 400H includes horizontally oriented connector frames 405H (i.e., the longer dimension thereof is horizontal), which are located so as to be aligned with horizontal installed positions in the bay 10. The vertical miplane 400V includes vertically oriented connector frames 405V (i.e., the longer dimension thereof is vertical), which are located so as to be aligned with vertical installed positions in the bay 10.

The midplanes 400 may be connected to the rear side of the common bay 100 in any convenient way. For example, mechanical fasteners such as screws, rivets, latches, snap-in features, or the like may be used to fasten the midplane 400 to the common bay 100.

1.4 Example Resource Modules

As noted above, the resource modules 600 may include multiple form factors. For example, in addition to the reference resource module 601 described above, the resource modules 600 may also include a double height resource module 602 and a large resource module 603, among others. The double height resource module 602 may have the same width and approximately double the height as the reference resource module 601. The large resource module 603 may have approximately four times the height and double the width as the reference resource module 601. In some examples, all of the resource modules 600 have the same depth.

More specifically, the double height resource module 602 illustrated in the figures has a height of $2h+\beta$, where $\beta$ is the mean distance between vertically adjacent horizontally oriented reference resource modules 601 in the adaptor 200 (see FIG. 8A) (in some examples, $\beta=\alpha$). In addition, the large resource module 603 illustrated in the figures has a height of $4h+3\beta$ and a width of $2w+\theta$, where $\theta$ is a width of the vertical divider 300 (see FIG. 5). Also note that, in the examples illustrated in the figures, the large resource module 603 has a width (excluding engagement features 610) of $d_4$. In general, widths of resource modules 600 may satisfy the formula $i \cdot w+(i-1)\theta$, where i is any integer, and heights of resource modules 600 may satisfy the formula $0+(j-1)\beta$, where j is any integer.

In some examples, the reference resource modules 601 may be storage resource modules, such as, for example, solid-state-drive modules. For example, the reference resource modules 601 may utilize the EDSFF form factor. In some examples, the double-height resource module 602 may be a memory resource modules, such as, for example a storage-class memory module. In some examples, the large resource modules 603 may be accelerator modules, such as field-programmable-gate-array (FPGA) modules.

2. Example Configurations of the Bay

FIGS. 7-11 illustrate various example configurations of the multi-configuration bay 10 and different combinations of resource modules 600 installed therein.

Figure 7A:
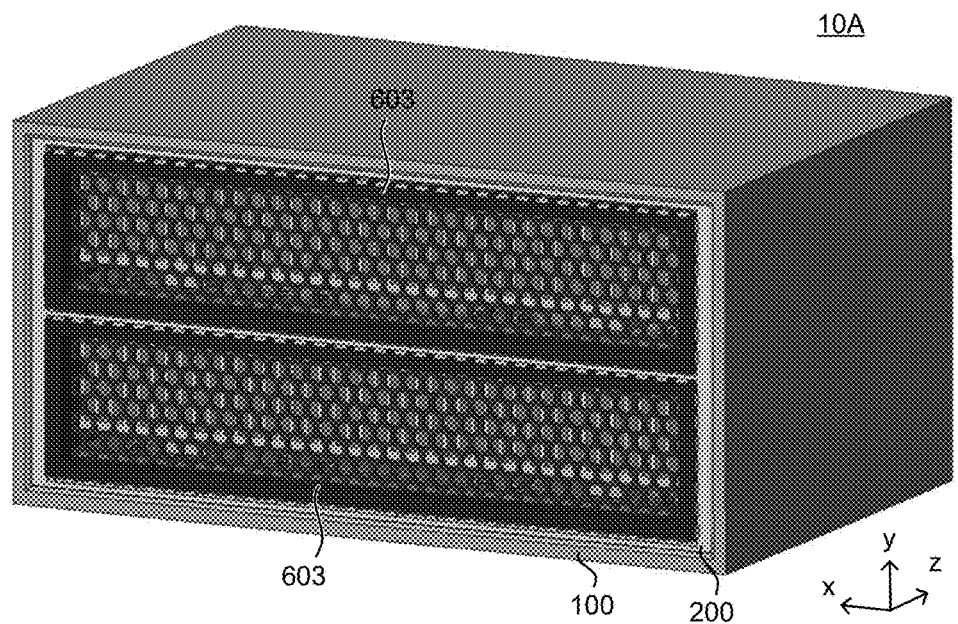
FIG. 7A illustrates a front perspective view of a first horizontal configuration of an example multi-configuration bay.
Figure 7B:
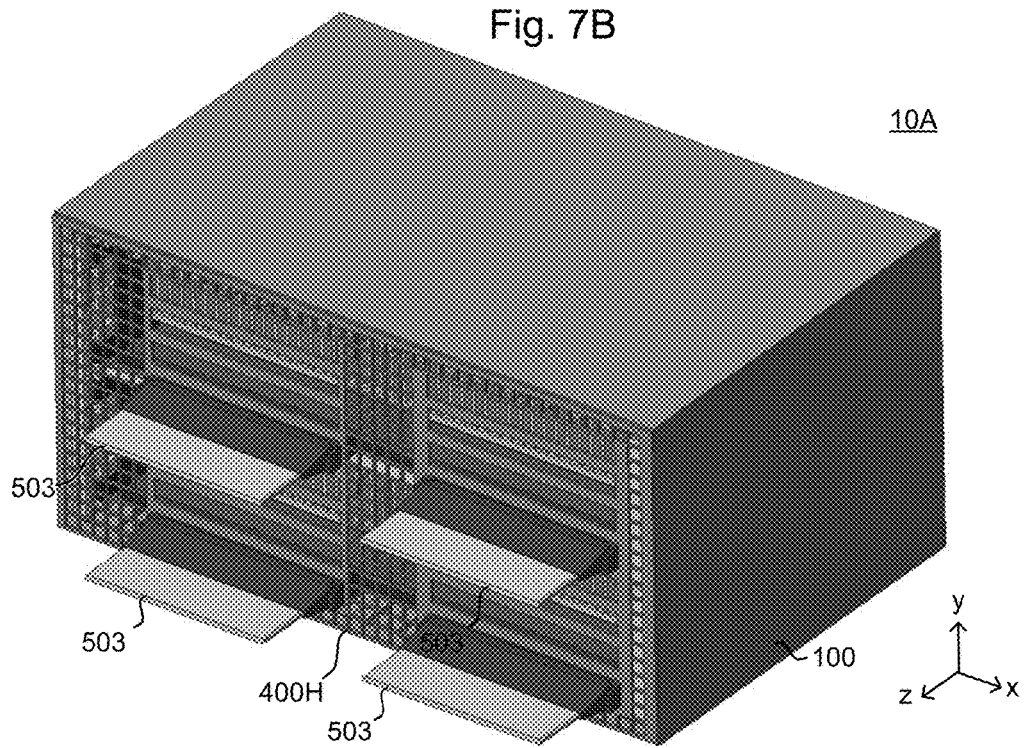
FIG. 7B illustrates a rear perspective view of the first horizontal configuration.

In FIGS. 7A-B, a first horizontal configuration of the multi-configuration bay 10 is illustrated. In the first horizontal configuration, the adaptor 300 is included in the common bay 100, and no vertical dividers 300 are included. Thus, there are two compartments 250 within the bay 10, each having widths of $d_4$. Thus, resource modules 600 having a width (excluding engagement features 610) of approximately $d_4$, such as the large resource module 603, would be installable horizontally within either compartment 250. In the illustrated example, each compartment 250 is filled with one a large resource module 603 that is horizontally oriented, for a total of two modules 603 in the multi-configuration bay 10. For example, the large resource modules 603 could be accelerator modules, such as field-programmable-gate-array (FPGA) modules. In other examples (not illustrated), one or both of the compartments 250 could have multiple resource modules installed therein, such as resource modules that have a width of $d_4$ but a height shorter than that of the large resource module 603. As illustrated in FIG. 7B, a horizontal midplane 400H is connected to a rear side of the common bay 100, and connectors 503 are connected to the midplane 400 so as to mate with connectors (not illustrated) on rear sides of the large resource modules 603.

Figure 9A:
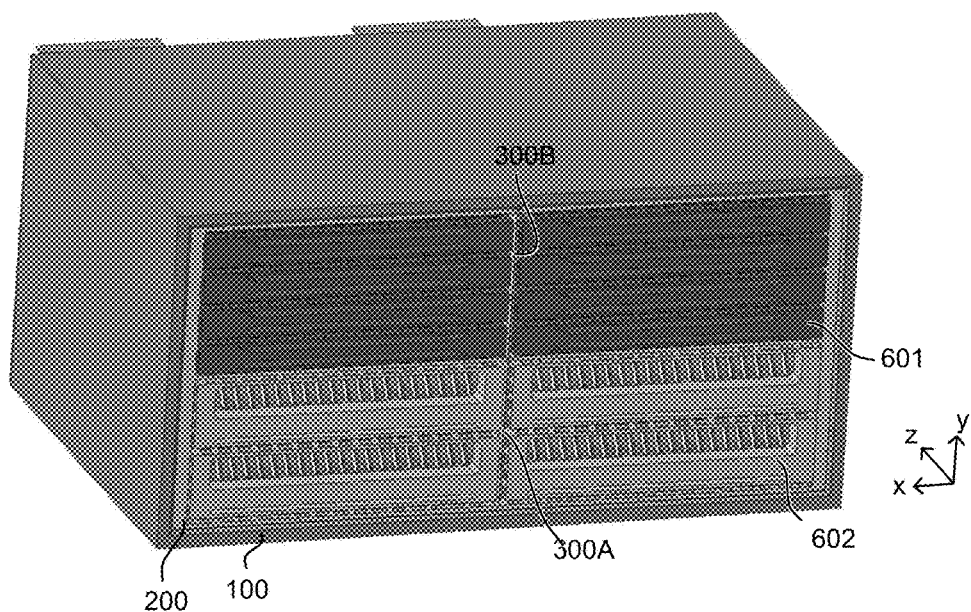
FIG. 9A illustrates a front perspective view of the second horizontal configuration with a second combination of resource modules.
Figure 9B:
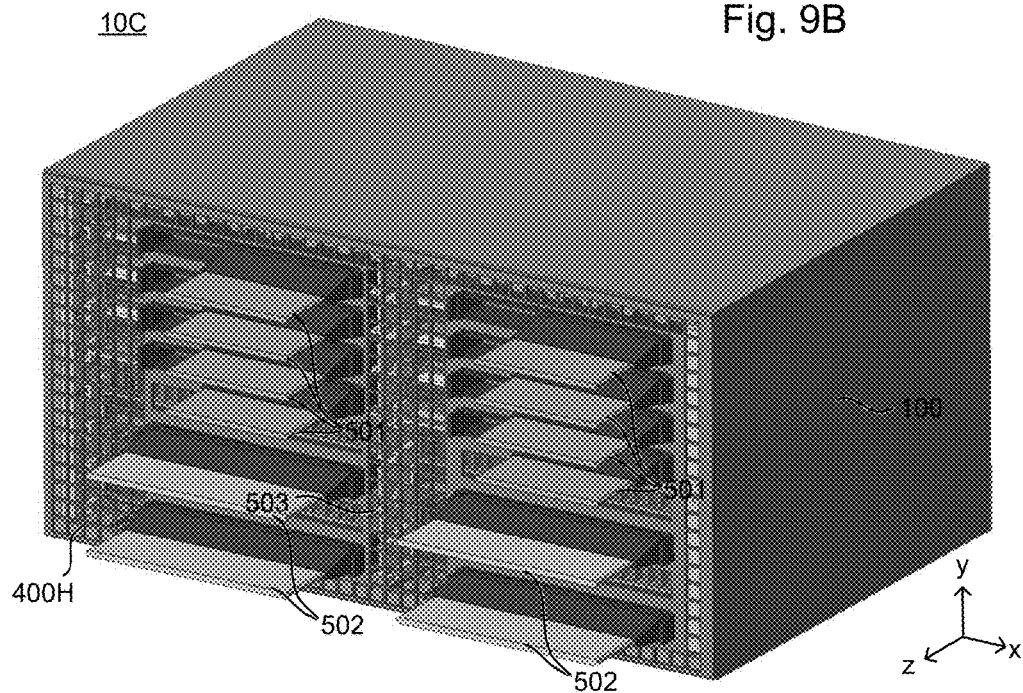
FIG. 9B illustrates a rear perspective view of the second horizontal configuration with the second combination of resource modules.

In FIGS. 8A-9B, a second horizontal configuration of the multi-configuration bay 10 is illustrated. In the second horizontal configuration, the adaptor 300 is included in the common bay 100, and two vertical dividers 300 are included (one in each compartment 250). Thus, there are four sub-compartments 251 within the bay 10, each having widths of $d_6$ (which also equals $d_2$). Thus, any resource module 600 having a width (excluding engagement features 610) of approximately $d_6$, such as the reference resource modules 601 and the double-height resource modules 602, would be horizontally installable within the compartments 251. Any combination of such resource modules 600 could be used. For example, FIGS. 8A-B illustrate an example in which sixteen reference resource modules 601 are used. As another example, FIGS. 9A-B illustrate another example in which eight reference resource modules 601 and four double-height resource modules 602 are used. For example, the reference resource modules 601 may be storage modules, such as hard-disk drive or solid state drive (SSD) modules. For example, the reference resource modules 601 may adhere to the EDSFF form factor. For example, the double height resource modules may be memory modules, such as storage-class-memory (SCM) modules. As illustrated in FIGS. 7B and 8B, in the second horizontal configuration a horizontal midplane 400H is connected to a rear side of the common bay 100, and connectors 501 and/or 502 are connected to the midplane 400 so as to mate with connectors (not illustrated) on rear sides of the reference resource modules 601 and/or double-height resource modules 602.

Figure 10A:
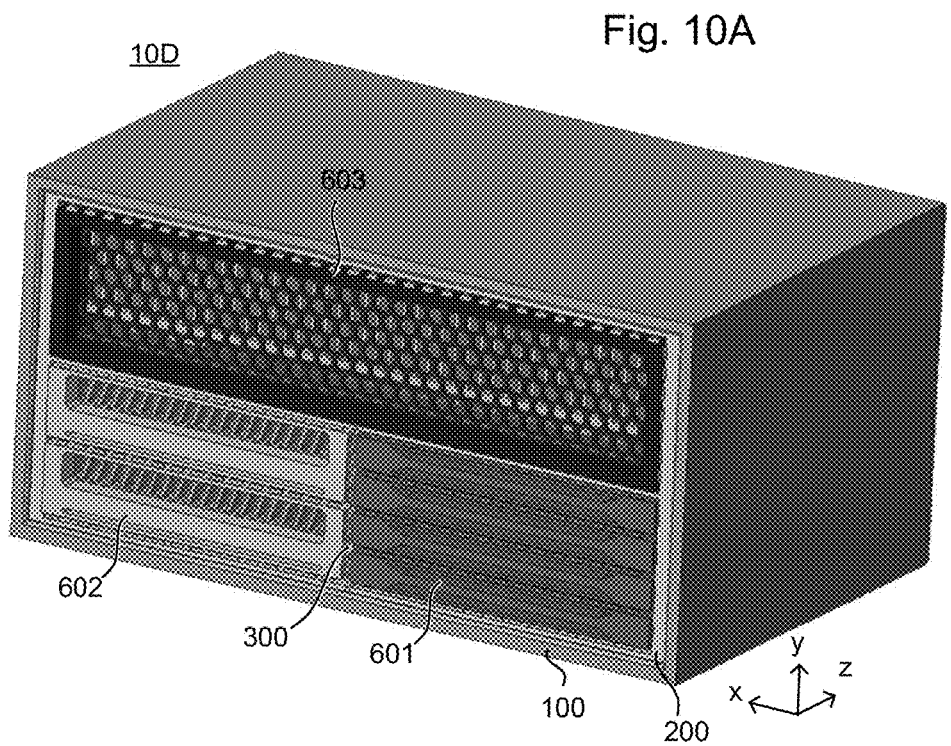
FIG. 10A illustrates a front perspective view of a third horizontal configuration of an example multi-configuration bay.
Figure 10B:
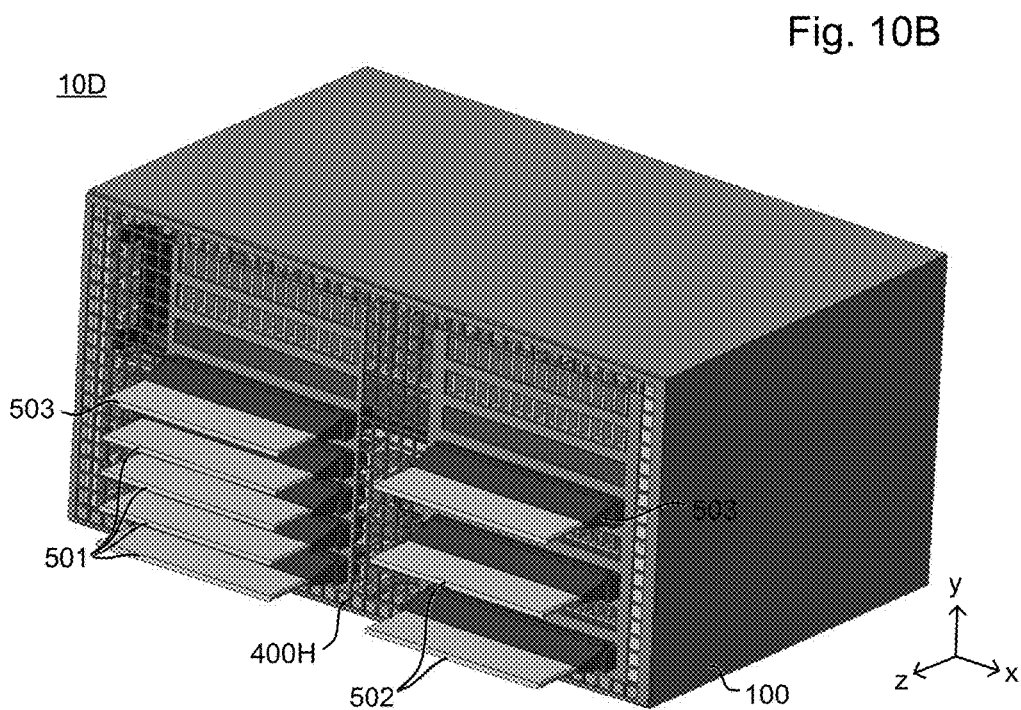
FIG. 10B illustrates a rear perspective view of the third horizontal configuration.

In FIGS. 10A-B, a third horizontal configuration of the multi-configuration bay 10 is illustrated. In the third horizontal configuration, the adaptor 300 is included in the common bay 100, and one vertical divider 300 is included. Thus, the bay 10 has one compartment 250 having a width of $d_4$ and two sub-compartments 251 each having widths of $d_6$ (which also equals $d_2$). Thus, any resource modules 600 having a width (excluding engagement features 610) of approximately $d_4$ would be horizontally installable within the top compartment 250, while any resource modules 600 having a width (excluding engagement features 610) of approximately $d_6$ would be horizontally installable within either of the bottom sub-compartments 251. In the illustrated example, the top compartment 250 is filled with a large resource module 603, the bottom-left sub-compartment 251 is filled with two double-height resource modules 602, and the bottom-right sub-compartment 250 is filled with four reference resource modules 601. As illustrated in FIG. 10B, in the third horizontal configuration, a horizontal midplane 400H is connected to a rear side of the common bay 100, and connectors 501-503 are connected to the midplane 400 so as to mate with connectors (not illustrated) on rear sides of the reference resource modules 601, double-height resource modules 602, and large resource modules 603, respectively.

In FIGS. 11A-B, a first vertical configuration of the multi-configuration bay 10 is illustrated. In the first vertical configuration, the adaptor 300 is not installed in the common bay 100. Thus, in this state, the interior of the common bay 100 to configured to receive vertically oriented resource modules 600 using the first rails 100. Because the distance between opposing first rails 110 is $d_2$, resource module 600 having a width (excluding engagement features 610) of approximately $d_2$, such as the reference resource modules 601 and double-height resource modules 602, would be installable within the common bay 100. In the illustrated example, ten reference resource modules 601 and four double-height resource modules 602 are installed in the common bay 100. As illustrated in FIG. 11B, a vertical midplane 400V is connected to a rear side of the common bay 100, and connectors 501 and 502 are connected to the midplane 400 so as to mate with connectors (not illustrated) on rear sides of the resource modules 601 and double-height resource modules 602, respectively.

3. Example Computing Device

Figure 12:
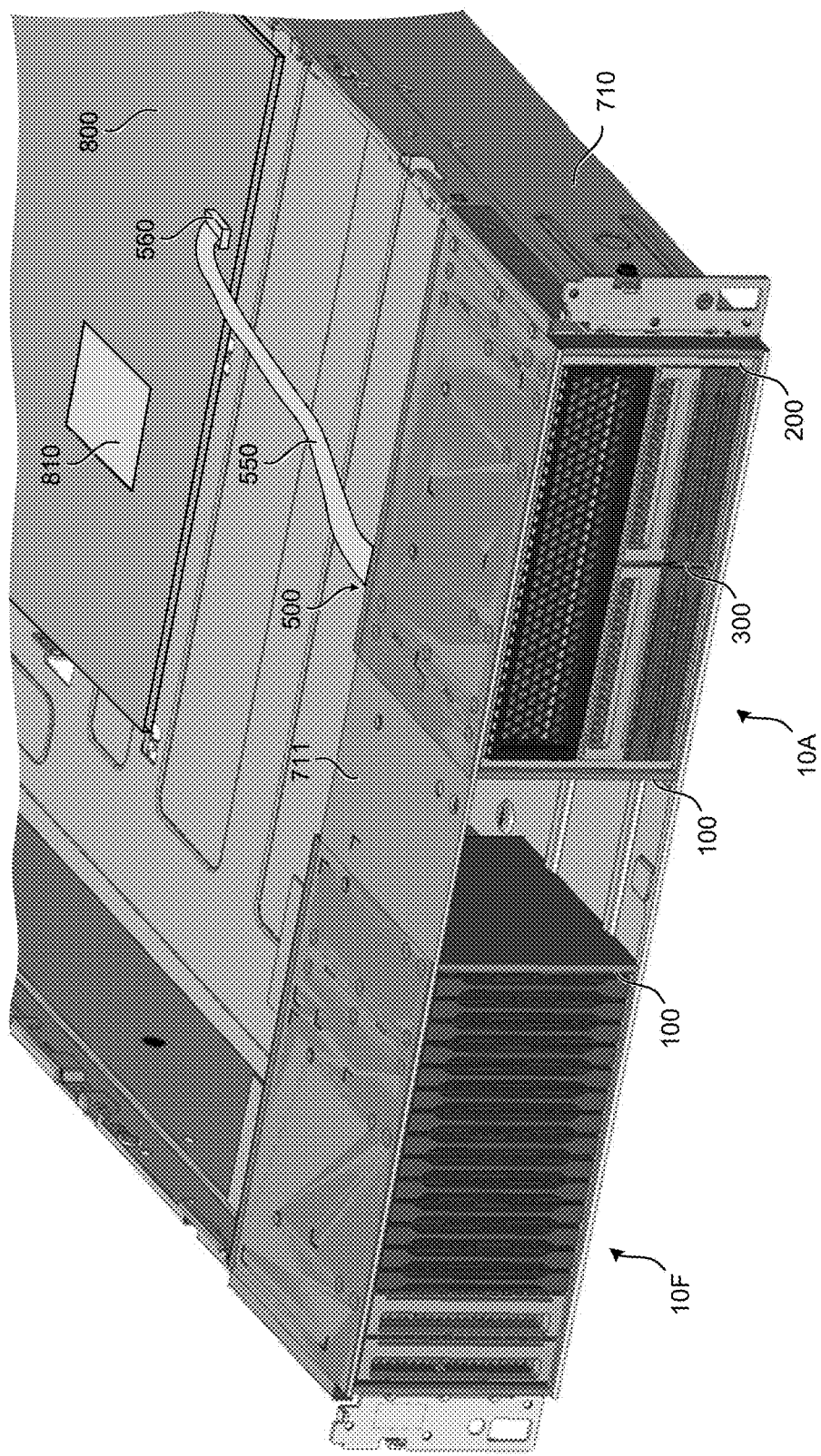
FIG. 12 illustrates a perspective view of a computing device with example multi-configuration bays.

FIG. 12 illustrates one example computing device 1000 (also referred to as an electronic device) that includes an example multi-configuration bay 10. The computing device 1000 includes a chassis 710 and one or more multi-configuration bays 10 to house resource modules 600.

In the illustrated example, there are two multi-configuration bays 10 in the computing device 1000—a first multi-configuration bay 10D that is configured in the third horizontal configuration and a second multi-configuration bay 10F that is configured in the first vertical configuration. Although two multi-configuration bays 10 are illustrate in FIG. 12, this is just one example and any number may be included.

As noted above, the multi-configuration bays 10 are to house resource modules 600 for processing units 810. In some examples, the resource modules 600 are part of the computing device 1000, as illustrated in FIG. 12. In other examples, the resource modules 600 may not yet be installed in the multi-configuration bays 10.

As noted above, the connectors 500 at the rear of the multi-configuration bays 10 may be to connect the resource modules 600 to the processing units 810 that are to utilize them. In some examples, the processing units 810 may be housed in the same chassis 710 as the multi-configuration bays 10, as illustrated in FIG. 12. For example, the computing device 1000 may include one or more printed circuit boards 800 in the chassis 710 that includes one or more processing units 810, and the connectors 500 may be connected to the printed circuit board(s) 800 (for example, via cabling 550 and a connector 560 on the board(s) 800). In some examples, the processing units 810 may be housed in a different chassis 710 and/or may be part of a different computing device 1000, in which case the resource modules 600 may be connected to the processing units 810 via a networking device (e.g., switch) or other inter-chassis interconnects that are connected to the connectors 500.

Computer.

As used herein, a "computer" is any electronic device that includes a processor and that is capable of executing programs comprising machine-readable instructions, including, for example, a server, a converged (or hyperconverged) appliance, a rack-scale system, some storage arrays, a personal computer, a laptop computer, a smartphone, a tablet, etc.

Provide:

As used herein, to "provide" an item means to have possession of and/or control over the item. This may include, for example, forming (or assembling) some or all of the item from its constituent materials and/or, obtaining possession of and/or control over an already-formed item.

A number.

Throughout this disclosure and in the appended claims, occasionally reference may be made to "a number" of items. Such references to "a number" mean any integer greater than or equal to one. When "a number" is used in this way, the word describing the item(s) may be written in pluralized form for grammatical consistency, but this does not necessarily mean that multiple items are being referred to. Thus, for example, a phrase such as "a number of active optical devices, wherein the active optical devices . . . " could encompass both one active optical device and multiple active optical devices, notwithstanding the use of the pluralized form.

The fact that the phrase "a number" may be used in referring to some items should not be interpreted to mean that omission of the phrase "a number" when referring to another item means that the item is necessarily singular or necessarily plural.

In particular, when items are referred to using the articles "a", "an", and "the" without any explicit indication of singularity or multiplicity, this should be understood to mean that there is "at least one" of the item, unless explicitly stated otherwise. When these articles are used in this way, the word describing the item(s) may be written in singular form and subsequent references to the item may include the definite pronoun "the" for grammatical consistency, but this does not necessarily mean that only one item is being referred to. Thus, for example, a phrase such as "an optical socket, wherein the optical socket . . . " could encompass both one optical socket and multiple optical sockets, notwithstanding the use of the singular form and the definite pronoun.

And/or.

Occasionally the phrase "and/or" is used herein in conjunction with a list of items. This phrase means that any combination of items in the list—from a single item to all of the items and any permutation in between—may be included. Thus, for example, "A, B, and/or C" means "one of {A}, {B}, {C}, {A, B}, {A, C}, {C, B}, and {A, C, B}".

Various example processes were described above, with reference to various example flow charts. In the description and in the illustrated flow charts, operations are set forth in a particular order for ease of description. However, it should be understood that some or all of the operations could be performed in different orders than those described and that some or all of the operations could be performed concurrently (i.e., in parallel).

While the above disclosure has been shown and described with reference to the foregoing examples, it should be understood that other forms, details, and implementations may be made without departing from the spirit and scope of this disclosure.

What is claimed is:

1. A multi-configuration bay, comprising:
   a common bay that includes a top wall, a bottom wall, side walls, and first rails on the top and bottom walls, the first rails are configured to hold resource modules in vertically oriented installed-positions within the common bay; and
   an adaptor that is installable within the common bay, the adaptor including side walls and second rails on the side walls, the second rails are configured to, when the adaptor is installed in the common bay, hold resource modules in horizontally oriented installed-positions within the common bay.

2. The multi-configuration bay of claim 1, further comprising:
   a vertical divider that is installable in the common bay between the side walls of the adaptor and that includes third rails that are configured to cooperate with the second rails to hold resource modules in horizontally oriented installed-positions.

3. The multi-configuration bay of claim 2,
   wherein one of the first rails includes a groove therein to receive an edge of the vertical divider when the vertical divider is installed in the common bay.

4. The multi-configuration bay of claim 2,
wherein the adaptor further comprises a horizontal wall connected to the side walls of the adaptor, the horizontal wall including one or more slots to receive tabs of the vertical divider when the vertical divider is installed in the common bay.

5. The multi-configuration bay of claim 1, further comprising:
latches that are configured to reversibly secure the adaptor within the common bay, the adaptor being removable from the common bay when the latches are disengaged.

6. The multi-configuration bay of claim 5,
wherein the latches include tabs that are slidable horizontally through the side walls of the adaptor and slots in side walls of the common bay, such that when the tabs are extended they mate with corresponding ones of the slots to secure the adaptor within the common bay.

7. The multi-configuration bay of claim 1, further comprising:
a horizontal midplane that is to connect to a rear of the common bay and that includes an outer frame, a mesh connected to the outer frame, and connector-frames connected to and defining apertures in the mesh,
wherein the connector frames are configured to receive and hold communications connectors and are located so as to be aligned with the horizontally oriented installed-positions when the horizontal midplane is connected to the common bay.

8. The multi-configuration bay of claim 1, further comprising:
a vertical midplane that is to connect to a rear of the common bay and that includes an outer frame, a mesh connected to the outer frame, and connector-frames connected to and defining apertures in the mesh,
wherein the connector frames are configured to receive and hold communications connectors and are located so as to be aligned with the vertically oriented installed-positions when the horizontal midplane is connected to the common bay.

9. The multi-configuration bay of claim 1,
wherein the adaptor includes a horizontal wall connected to the side walls of the adaptor, a bottom span connected to bottom-front corners of the side walls of the adaptor and including EMI contacts, and a top span connected to top-front corners of the side walls of the adaptor and including additional EMI contacts.

10. An electronic device comprising:
a chassis,
the multi-configuration bay of claim 1 disposed in the chassis with the adaptor installed in the common bay, and
resource modules installed in the multi-configuration bay in the horizontally oriented installed-positions.

11. The electronic device of claim 10, further comprising:
a vertical divider disposed in the common bay between the side walls of the adaptor that includes third rails that are configured to cooperate with the second rails to hold resource modules in horizontally oriented installed-positions.

12. The electronic device of claim 10, further comprising:
a midplane that is connected to a rear of the common bay and that includes an outer frame, a mesh connected to the outer frame, and connector-frames connected to and defining apertures in the mesh,
wherein the connector frames hold communications connectors that are connected to the installed resource modules.

13. The electronic device of claim 10,
wherein the adaptor includes a horizontal wall connected to the side walls of the adaptor that partitions the common bay into two full-width compartments.

14. The electronic device of claim 10,
wherein the adaptor includes a horizontal wall connected to the side walls of the adaptor that partitions the common bay into two full-width compartments.

15. The electronic device of claim 10, further comprising:
one or more vertical dividers disposed between the side walls of the adaptor and between a bottom wall of the common bay and the horizontal wall of the adaptor that partition one or both of the full-width compartments into two or more partial-width compartments.

16. A method of manufacturing an electronic device, comprising:
providing a chassis,
providing the multi-configuration bay of claim 1,
identifying a desired configuration for resource modules in the electronic device,
installing the common bay in the chassis, and
determining whether to install the adaptor in the common bay based on the desired configuration.

17. The method of claim 16, further comprising:
in response to the desired configuration including horizontally oriented resource modules in the multi-configuration bay, installing the adaptor in the common bay.

18. The method of claim 16, further comprising:
in response to the desired configuration including vertically oriented resource modules in the multi-configuration bay, not installing the adaptor in the common bay.

19. The method of claim 16,
wherein the multi-configuration bay includes a horizontal midplane and a vertical midplane, both being configured to connect to a rear of the common bay and including an outer frame, a mesh connected to the outer frame, and connector-frames connected to and defining apertures in the mesh,
the connector frames of the horizontal midplane are configured to receive and hold Gen-Z connectors and are located so as to be aligned with the horizontally oriented installed-positions
the connector frames of the vertical midplane are configured to receive and hold Gen-Z connectors and are located so as to be aligned with the vertically oriented installed-positions; and
the method further comprises determining whether to connect the horizontal midplane or the vertical midplane to the common bay based on the desired configuration.

20. A multi-configuration bay, comprising:
a common bay that includes a top wall, a bottom wall, side walls, and first rails on the top and bottom walls, the first rails are configured to hold resource modules in vertically oriented installed-positions within the common bay; and
an adaptor that is disposed within and reversibly secured to the common bay, the adaptor including side walls, a horizontal wall connected to the side walls, and second rails on the side walls, the second rails are configured to, when the adaptor is installed in the common bay, hold resource modules in horizontally oriented installed-positions within the common bay,
wherein the adaptor is removable from the common bay.

* * * * *